United States Patent
Astra et al.

(10) Patent No.: US 10,365,337 B2
(45) Date of Patent: Jul. 30, 2019

(54) SUPERCONDUCTING MAGNET COIL ARRANGEMENT

(71) Applicant: SIEMENS PLC, Camberley (GB)

(72) Inventors: Eugene Astra, Oxfordshire (GB); Hugh Alexander Blakes, Oxfordshire (GB); Peter Jonathan Davis, Oxfordshire (GB); Yunxin Gao, Oxfordshire (GB); Graham Hutton, Oxfordshire (GB); Matthew John Longfield, Oxfordshire (GB)

(73) Assignee: Siemens Healthcare Limited, Camberley (GB)

( * ) Notice: Subject to any disclaimer, the term of this patent is extended or adjusted under 35 U.S.C. 154(b) by 877 days.

(21) Appl. No.: 14/765,659

(22) PCT Filed: Feb. 4, 2014

(86) PCT No.: PCT/EP2014/052162
§ 371 (c)(1),
(2) Date: Aug. 4, 2015

(87) PCT Pub. No.: WO2014/118390
PCT Pub. Date: Aug. 7, 2014

(65) Prior Publication Data
US 2015/0377991 A1 Dec. 31, 2015

(30) Foreign Application Priority Data
Feb. 4, 2013 (GB) .................................. 1301909.6

(51) Int. Cl.
H01F 6/00 (2006.01)
G01R 33/3815 (2006.01)
H01F 6/02 (2006.01)
H01F 6/06 (2006.01)
G01R 33/38 (2006.01)
H01F 6/04 (2006.01)

(52) U.S. Cl.
CPC ..... *G01R 33/3815* (2013.01); *G01R 33/3804* (2013.01); *H01F 6/02* (2013.01); *H01F 6/06* (2013.01); *H01F 6/04* (2013.01)

(58) Field of Classification Search
CPC ................... H01F 6/00–6/065; G01R 33/3815
See application file for complete search history.

(56) References Cited

U.S. PATENT DOCUMENTS

| 3,818,396 A | 6/1974 | Raphael |
| 3,869,686 A | 3/1975 | Benz |
| 4,812,796 A | 3/1989 | Ries |
| 4,848,103 A | 7/1989 | Pelc et al. |

(Continued)

FOREIGN PATENT DOCUMENTS

| CN | 101447325 A | 6/2009 |
| CN | 102664086 A | 9/2012 |

(Continued)

*Primary Examiner* — Ramon M Barrera
(74) *Attorney, Agent, or Firm* — Schiff Hardin LLP

(57) ABSTRACT

A superconducting magnet coil arrangement has multiple superconducting coils and at least one of the superconducting coils is provided with a secondary coil of insulated resistive wire mechanically attached to a surface of the superconducting coil.

26 Claims, 4 Drawing Sheets

(56) References Cited

U.S. PATENT DOCUMENTS

| | | | |
|---|---|---|---|
| 4,935,714 A * | 6/1990 | Vermilyea | G01R 33/3815 324/318 |
| 8,306,589 B2 | 11/2012 | Blakes et al. | |
| 9,230,724 B2 | 1/2016 | Harrison | |
| 2006/0284711 A1 | 12/2006 | Atkins et al. | |
| 2006/0291112 A1 | 12/2006 | Markiewicz | |
| 2008/0290871 A1 | 11/2008 | Tamura | |
| 2009/0031554 A1 | 2/2009 | Hobbs et al. | |
| 2010/0102908 A1 | 4/2010 | Wang | |
| 2011/0082043 A1 | 4/2011 | Wang et al. | |
| 2011/0152102 A1 | 6/2011 | Claassen | |
| 2012/0108433 A1 | 5/2012 | Jiang et al. | |
| 2012/0196753 A1 | 8/2012 | Laskaris et al. | |
| 2013/0176090 A1 | 7/2013 | Calvert et al. | |

FOREIGN PATENT DOCUMENTS

| | | |
|---|---|---|
| GB | 2487813 A | 8/2012 |
| JP | S53109495 A | 9/1978 |
| JP | H0432587 U | 3/1992 |
| JP | H04237105 A | 8/1992 |
| JP | H0529137 A | 2/1993 |
| JP | H06151984 A | 5/1994 |
| JP | H07235412 A | 9/1995 |
| JP | 2007335616 A | 12/2007 |
| JP | 2009172085 A | 8/2009 |
| JP | 2011138892 A | 7/2011 |
| JP | 2011255027 A | 12/2011 |
| KR | 20150007149 A | 1/2015 |
| WO | WO-2011/118501 A1 | 9/2011 |
| WO | WO-2011/122403 A1 | 10/2011 |
| WO | WO-2012/123711 A1 | 9/2012 |
| WO | WO-2013/102509 A1 | 7/2013 |

\* cited by examiner

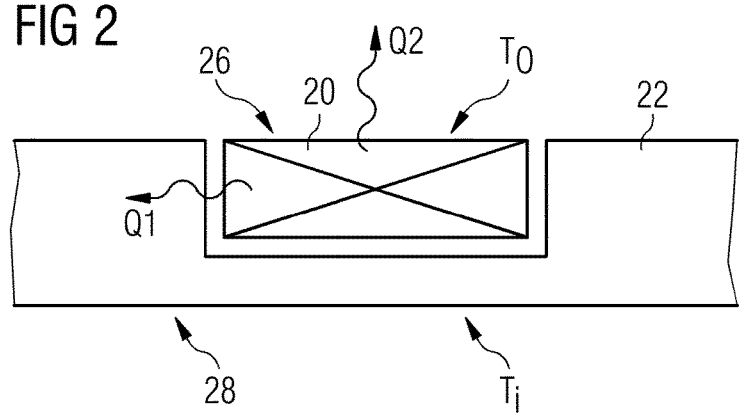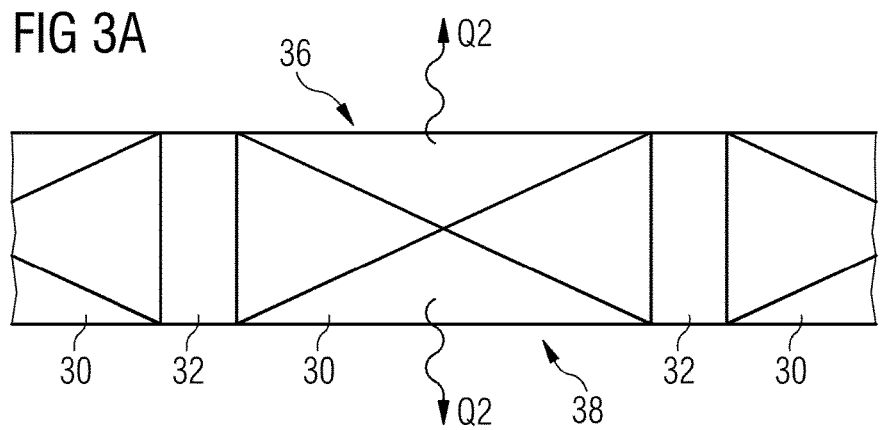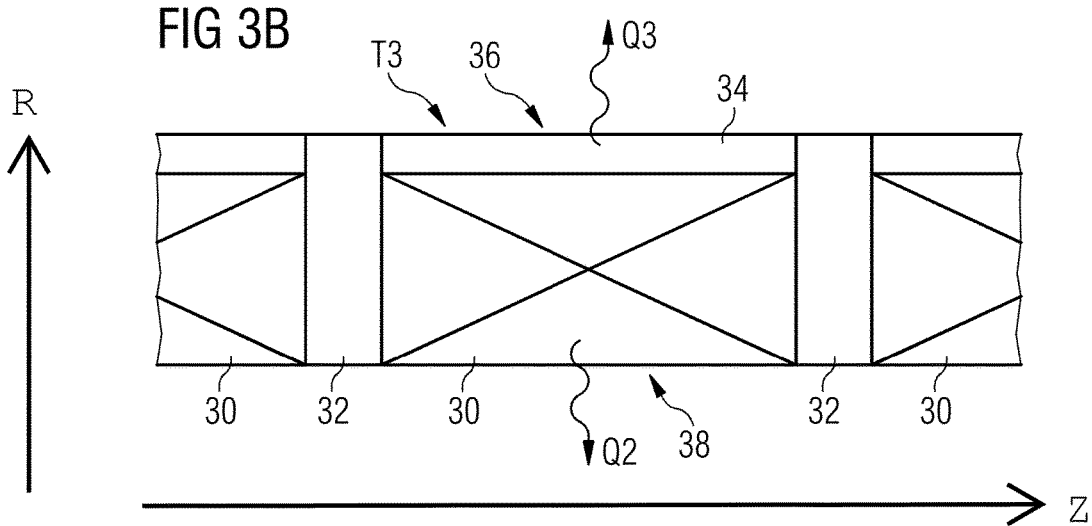

SUPERCONDUCTING MAGNET COIL ARRANGEMENT

BACKGROUND OF THE INVENTION

Field of the Invention

The present invention concerns a superconducting magnet coil arrangement, as well as a method for reducing a quench pressure within a cryogen vessel that contains a superconducting magnet coil arrangement.

Description of the Prior Art

In a superconducting magnet assembly for MRI applications, a liquid cryogen such as helium is often provided within a cryogen vessel which also contains superconducting coils supported on a mechanical retaining structure such as a former. During a quench event, as is well known, energy stored in the superconducting coils is dissipated as heat causing boiling of the cryogen. The boiling of the cryogen increases the pressure within the cryogen vessel, known as quench pressure, until a pressure-limiting device such as a valve or a burst disc opens to provide a gas egress path at a certain quench pressure.

The standard approach for magnet design is to minimize the increase in coil temperature during a quench, and to design a large supporting former which mechanically supports and retains the coils, and also acts as a heat sink for the magnet coils. During a quench event, heat from the coils is conducted to the former, which is typically of aluminum or stainless steel. This limits the rise in the temperature of the surface of the coils and the former in contact with the cryogen.

Conventional superconducting magnets are cooled down to about 4K using liquid helium to induce a superconducting state. The magnet coils are ramped to a specified electric current, which has an associated stored energy. When a superconducting magnet undergoes a transition from the superconducting state to the normal/resistive state, as in a quench, any stored electrical current is transferred from the superconductor filaments into the copper cladding typically provided around superconducting filaments. An amount of heat is generated by Ohmic heating of the magnet coils. The heat from the magnet coils is then transferred via thermal conduction into the former and the liquid helium, both of which are in thermal and mechanical contact with the coils.

The amount of energy dissipated and the rate at which the stored energy is transferred from the magnet coils into the liquid helium, together with the volume of helium and the geometry of the pressure vessel containing the magnet and helium determine the quench pressure within the helium vessel. For example, the design of the helium vessel and the available turret venting path cross-section will influence the fluid impedance experienced by escaping cryogen gas. High quench pressures are undesirable because of the need to increase the pressure vessel wall thickness, and therefore cost and weight, to cope with such pressures and the need to increase the cross-sectional area of the turret to relieve the quench pressure.

Increased turret area will increase its thermal heat load into the helium vessel, which results in the requirement of increasing the cooling power required from an associated cryogenic refrigerator. It is preferred to minimize the required cooling power, for reasons of cost.

Current superconducting magnet designs use the parameters of operating current and number of turns—which determines the energy stored in the magnet coils, quench propagation circuit properties, vent path area, and vessel strength to engineer a solution for managing the quench pressure.

FIG. 2 schematically represents a conventional cylindrical magnet structure with superconducting coils 20 wound onto an aluminum former 22, which acts as a heat sink. A radially outer surface 26 of the superconducting coil 20 directly contacts liquid cryogen, and forms the main interface for heat transfer from the coil to the liquid cryogen to cool the coil.

Conventionally, during a quench, radially outer surface 26 is at a temperature $T_o$, typically about 80K, while the radially inner surface 28 of the former 22 is at a temperature $T_i$, typically about 20K. Heat flows Q1, Q2 are shown, where Q1 represents heat flux from coil 20 to former 22, while Q2 represents heat flux from coil 20 to adjacent cryogen. Some conventional arrangements dispense with the former, thereby providing more effective cooling of the radially inner surface of the coils due to increased contact surface area between coils and cryogen.

The present invention provides a superconducting magnet in which the magnet coil structure comprises a resistive element that will control the surface temperature of the magnet coil structure, so controlling the rate of heat dissipated into the liquid cryogen. In preferred embodiments, the superconducting magnet does not have the conventional former, which acts as a heat sink.

The resistive element is provided as a secondary coil of insulated resistive wire mechanically attached to a surface of the superconducting coil which will control the rate of cryogen boiloff caused by the quench, in turn determining the quench pressure for a given cryogen vessel and quench path exit, which in turn determines the required strength of the cryogen vessel. By reducing the rate of heat transfer to the cryogen, the required volume of cryogen may be reduced, the peak quench pressure may be reduced and so the cryogen vessel may be made of a thinner material, and/or the quench path exit may be reduced in size, in turn reducing a source of heat influx into the cryogen vessel.

SUMMARY OF THE INVENTION

The present invention provides methods and apparatus to deliberately increase the temperature of the coil surface in contact with the liquid cryogen, so that the heat transfer from the coil into the liquid cryogen is reduced.

This is achieved by inducing a film boiling phase of the cryogen at the surface of the coil, which reduces the rate of cryogen boiloff at quench, so also reducing the quench pressure. Reduced quench pressure may be achieved in this way without the need to increase the vent path cross-sectional area from the cryogen vessel and reduces the need for cryogen vessel strength to resist quench pressures. The present invention provides coil structures which limit quench pressures significantly less than for conventional structures. Therefore the pressure vessel thickness can be reduced and the quench path exit, also called vent path, or turret, can be reduced in cross sectional area. This cross-sectional area may be referred to as "diameter" below, for brevity, but it is to be noted that the vent path cross sectional may be of any shape, and need not be circular.

U.S. Pat. No. 4,223,723 suggests to remove any film boiling of a liquid cryogen at a surface of a cooled article by providing holes in the cooled article and therefore increase the heat transfer from the article into liquid cryogen, so as to increase the effectiveness of the cryogen. The present invention runs counter to the teachings of this prior art, and provides increased surface temperature, thus promoting the film boiling regime and therefore counter-intuitively reduces the heat transfer into liquid cryogen. This reduces the effectiveness of the cryogen cooling during a quench and therefore reduces the quench pressure.

It is a task of the designer when designing a superconducting magnet employing the present invention to choose appropriate coil structures, cryogen vessel design, vent path or turret diameter, cryogen capacity, to withstand the pressure of cryogen gas at quench, yet to limit the weight, dimensions and cost of the system where possible. The present invention enables improvements in at least some of these parameters, as may be applied by the designer.

BRIEF DESCRIPTION OF THE DRAWINGS

FIG. 2 shows a conventional construction of superconducting coils wound into a former.

FIG. 3A illustrates a structure according to an embodiment of the present invention in which no former is provided, but other arrangements are provided to realize the present invention.

FIG. 3B illustrates a structure according to an embodiment of the present invention in which a coil structure comprises a resistive secondary coil on a radially outer surface of superconducting coils.

DESCRIPTION OF THE PREFERRED EMBODIMENTS

The quench pressure is related to the rate at which heat is transferred from the magnet coils into the liquid cryogen during a quench event. The rate at which heat is transferred from the magnet coils into the liquid cryogen is in turn related to the interaction between the liquid cryogen and the coil surface.

The liquid cryogen in contact with a surface of a coil boils when heated. This boiling reduces the surface area of the coil in contact with liquid cryogen and so reduces a coefficient of heat transfer from the coil into the cryogen. The boiling regime, discussed further below, and so also the heat transfer coefficient, changes with temperature of the cooled surface of the coil.

The quench pressure can therefore be affected by the coil surface temperature by way of varying the boiling regime.

Figure 1A:
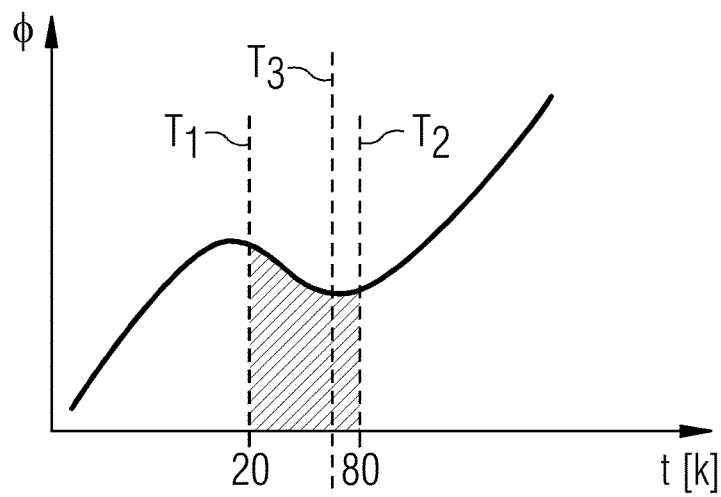
FIG. 1A illustrates the relative heat flux over a range of temperature differentials between liquid cryogen and a bulk coil temperature.

FIG. 1A illustrates various boiling regimes of liquid helium in contact with a cooled article over a range of temperatures. In the present case, it illustrates the variation in wall heat flux $\varphi$ as a function of the coil bulk temperature t expressed as a difference in temperature between a bulk coil and a liquid cryogen.

Between about 4K and about 16K, bubble boiling occurs. Heat flux $\varphi$ increases as the temperature differential t between liquid helium and the coil bulk increases. From about 16K upwards, mixed boiling occurs, where some bubbles are produced, and some film boiling occurs. This results in unstable contact surface area between liquid cryogen and cooled surface. For example, this is observed at $T_1$, where the temperature difference is 20K.

As the temperature difference t rises in this region, the proportion of film boiling increases, and the heat flux $\varphi$ decreases, despite the increasing temperature differential t, due to reducing surface area of liquid cryogen in contact with the cooled surface.

This boiling regime of helium is counterintuitive in that, in a certain range of temperature differentials, by increasing the surface temperature, the rate of heat transfer into the helium can be reduced and therefore the quench pressure also reduced. This only works within a certain range of temperature-pressure combinations for a particular structure and a particular cryogen. In the illustrated example, this range is between about $T_1$=20K and about $T_2$=80K for the example structure under consideration.

Figure 1B:
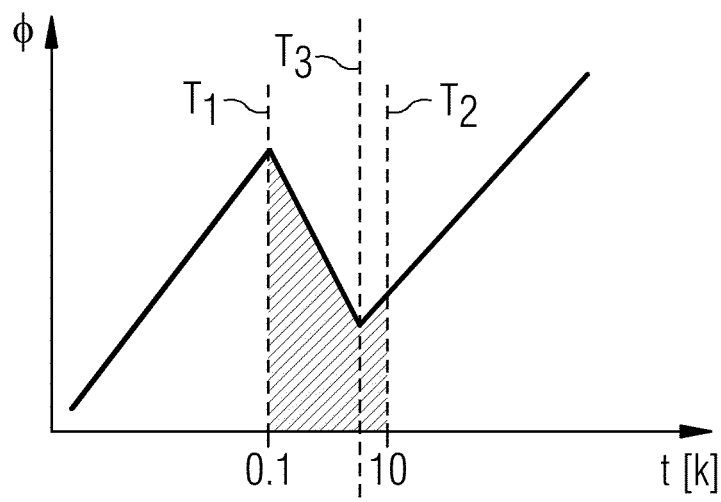
FIG. 1B illustrates the relative heat flux over a range of temperature differentials between liquid cryogen and a coil surface temperature.

FIG. 1B resembles FIG. 1A, but differs in that the temperatures are expressed as temperature differential between liquid helium and surface temperature of a cooled article. Labelled temperature differentials $T_1$, $T_2$, $T_3$ have the same significance as discussed with reference to FIG. 1A.

In conventional magnet designs, such as illustrated in FIG. 2, superconducting coils 20 are wound into a former 22 and the temperature of the coils during a quench is limited by a quench propagation circuit which reacts to the onset of a quench within one coil by inducing a quench in all coils, so that the stored energy is dissipated relatively evenly between the coils. In such magnet designs, the surface temperature of the coils during a quench is determined by the quench propagation circuit and the former structure and material. The former 22 structure acts as a large heat sink into which the energy from the coils 20 is transferred and thus limits the temperature rise of the surfaces of the coils and the former. In standard magnet designs, the boiling regime of the liquid cryogen at the surface of the coils and the former structure is predominantly bubble boiling which provides a high energy transfer rate into the cryogen, and therefore a relatively high quench pressure as the liquid cryogen boils rapidly.

According to an aspect of the present invention, a structure is proposed in which the surface temperature of the coils is intentionally raised during a quench. Preferably, the attendant boiling of liquid cryogen remains within the mixed boiling regime, shown between about $T_1$ and $T_3$ in FIG. 1B, or may reach the lower-temperature extremity of the film-boiling range, for example in the surface temperature range of about $T_3$ to $T_2$. Accordingly, by raising the coil surface temperature within this region $T_1$-$T_2$, the heat flux $\varphi$—the rate of transfer of thermal energy to the cryogen—actually reduces. Due to this reduction in rate of transfer of thermal energy, the rate of generation of cryogen gas, and so also the quench pressure, may be reduced as compared to its conventional value. In turn, the required diameter of quench gas egress path may be reduced. As can be seen from FIG. 1B, the minimum rate of heat transfer □□ from the coils to the liquid cryogen can be achieved when the temperature differential t between the bulk of the coils and the liquid cryogen is about $T_3$, being at the upper range of mixed boiling, just as film boiling begins.

With film boiling, the temperature difference t between the coil surface and the liquid cryogen (FIG. 1B) is so great that a layer of boiled-off cryogen gas continuously exists between the coil surface and the liquid cryogen. This reduces the thermal conduction between coil surface and liquid cryogen, by a factor of up to fifty. The rate of heat transfer ☐ is at a minimum when this gas layer is in place, but the temperature difference between coil and cryogen is the minimum for film boiling, shown in FIG. 1B at $T_3$, about 75K.

According to the present invention, arrangements are provided to optimize the surface temperature of the magnet coils. In preferred embodiments of the present invention, no former 22 is provided.

In the superconducting magnet coil arrangement of FIG. 3A, no former is provided. Rather, coils 30 are impregnated with resin and bonded together by spacers 32, which provide mechanical support and retention, while ensuring appropriate relative positioning of the coils. These spacers 32 may be porous structures such as metal foam or glass fiber which are impregnated or adhesively bonded with resin so that a self-supporting structure of coils and spacers is produced. In some embodiments, a single impregnation step is used to impregnate the coils 30 and the spacers 32, so that a monolithic structure is formed. The absence of a conventional former removes a large heat sink or thermal shroud which conventionally acts to limit the temperature rise of the coil surfaces in contact with the former, and reduces the temperature rise of coil surfaces in contact with liquid cryogen.

In the absence of a former, heat flux Q1 illustrated in FIG. 2 cannot occur. As both radially outer 36 and radially inner 38 surfaces of the coils 30 are exposed to cryogen, similar heat flux Q2 flows from each of these surfaces to the liquid cryogen.

FIG. 3B shows a superconducting magnet structure according to an embodiment of the present invention. No conventional former structure is provided. A resistive, yet relatively conductive, secondary coil 34 is wound onto a radially outer surface of at least one, but preferably all, of the superconducting coils 30, as an overbinding. The secondary coil(s) 34 may be of high purity aluminum wire. They may each be electrically connected as a short circuit, or several or all secondary coils 34 may be connected in series in one closed circuit.

As illustrated, the secondary coils 34 may be provided as an overbinding over the superconducting coils 30. The secondary coils 34 are electrically isolated from the superconducting coils 30, but are inductively coupled to them.

The secondary coils 34 play no part in normal operation of the superconducting magnet. However, during a quench, the reduction in magnetic field generated by the superconducting coils 30 induces a current in each of the secondary coils to provide a heated radially outer surface 36 of the secondary coils 34 in contact with cryogen due to ohmic heating of the secondary coils. In a preferred arrangement, liquid helium is used as the cryogen, and a surface of the secondary coils in contact with the helium is heated to a temperature in excess of 100K. Alternatively, a quench propagation circuit may be provided. In this case, the secondary coil(s) 34 is/are not connected in a closed loop, but are connected to a circuit which causes current to flow through them when onset of a quench is detected, by any suitable known arrangement.

As shown in FIG. 3B, heat flux Q2 may flow from the radially inner surface 38 as in the arrangement of FIG. 3A. However, a different heat flux Q3 will flow from the radially outer surface 36, due to the effect of ohmic heating by the secondary coil 34. For use as resistive heaters, the turns of the secondary coils 34 must be electrically insulated from each other, for example using a glass fiber braid, to reduce or prevent shorted turns in the secondary coils. In similar structures where the overbinding wire is used for mechanical purposes only, there is no need to provide electrical insulation between the turns. The secondary coils 34 are preferably resin-impregnated, in the same manner as the superconducting coils. Such impregnation may be achieved in a common impregnation step with the impregnation of the superconducting coils 30.

The overbinding is preferably arranged to have a similar thermal expansion to that of the superconducting coil, to minimize thermally induced stresses between superconducting coil and overbinding as their temperatures vary. Conventional overbinding for mechanical strength is typically provided by stainless steel wire, and is not electrically insulated or connected as a circuit. The overbinding of the present invention forms one or more closed electrical circuits and is preferably of a wire with higher electrical conductivity, such as aluminum.

Similar secondary coils may alternatively, or additionally, be provided on the radially inner surface 38 of one or more superconducting coils 30 in other embodiments of the present invention. However, in cylindrical superconducting magnets for MRI systems, such as those illustrated, it is generally required to keep the inner diameter of the magnet structure as large as possible, for a given quantity of superconducting wire. It may accordingly be preferred to place the secondary coils 34 only on the radially outer surface of the superconducting coils, as illustrated.

The reduced rate of boiloff of liquid cryogen provided by the invention means that a superconducting magnet will retain more of its cryogen after quench, extending the time during which is will remain cold during and after a quench. The requirement for providing large-diameter escape paths for boiled-off cryogen will be reduced. The required quantity of liquid cryogen may accordingly be reduced, saving on material costs.

The reduced heat flow to the cryogen reduces the temperature gradient across the axial cross-section of each superconducting coil, to provide a more even temperature distribution though the material of the coil, reducing the likelihood of damage to the coils during quench.

In other embodiments, a former of a thermally conducting material such as aluminum may be used, and may act as an efficient heat sink, drawing heat from a quenching superconducting coil more efficiently than heat transfers from the coil to the cryogen. Heat can then be transferred from the former to the cryogen. In other arrangements, a former or other retaining structure of a thermally resistive material, such as a resin impregnated composite, may be used. Little heat will be carried through the material of the former and secondary coils of the present invention are provided on an exposed surface of the coils to provide reduced heat flux into liquid cryogen.

The characteristics of the overbind forming the secondary coil(s) may be used in the optimization of quench current.

While a superconducting magnet is at field, in use in the normal persistent mode, it is preferred that a surface boiling regime provides high rates of heat transfer from the coils into the liquid cryogen and thus maximizes the cooling efficiency. This is generally obtained within the bubble boiling phase, illustrated in FIG. 1B at a temperature difference t between coil surface and liquid cryogen of up to about 16K.

According to features of the present invention, the rate of heat transfer φ from the coils into the cryogen is reduced during quench, thus reducing the rate of generation of cryogen gas, the quench pressure inside the cryogen vessel, and the diameter of the necessary quench gas egress path.

Figure 4:
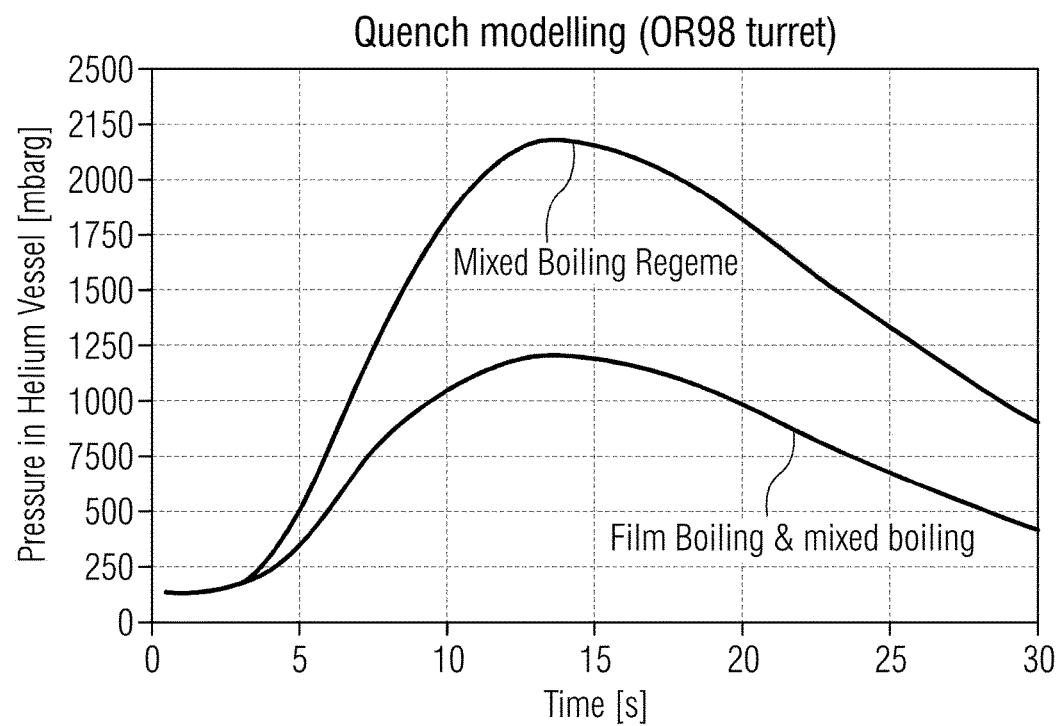
FIG. 4 shows the evolution of quench pressure with time for a conventional arrangement such as illustrated in FIG. 2, and for an arrangement according to the present invention.

FIG. 4 shows the calculated quench pressure for the mixed boiling phase for a standard magnet design, and a calculated quench pressure for the film boiling phase which is achieved by optimizing the coil surface temperature and removing a former according to an embodiment of the present invention. The lower curve represents the evolution of quench pressure over time for a magnet structure according to an embodiment of the invention during film boiling, while the upper curve represents the evolution of quench pressure over time for mixed boiling in a conventional magnet structure similar to that illustrated in FIG. 2.

It is conventional to employ small heaters in thermal contact with superconducting coils to propagate a quench among several coils of a superconducting magnet structure. Such heaters may be affixed to a radially outer surface of a coil, or may be embedded within the structure of a coil.

In alternative embodiments, solid single turn conductive bands may be provided as single-turn secondary coil 36 to provide resistive heating of coil surfaces during quench events.

In embodiments where formers are provided, means may be provided to heat the former in response to a quench, prompting film boiling at interfaces between the former and liquid cryogen, and reducing thermal stress due to temperature differences between coils and former.

In a further embodiment, conventional "dump" resistors, used to dissipate energy outside of a cryostat, may be replaced by resistive wire on the coils, connected into a quench circuit, and will heat the surfaces of the coils to promote film boiling according to the present invention. A resistive overbinding may be electrically connected into a circuit and arranged to receive an electric current for the purpose of adjusting a coil surface temperature, rather than simply carrying a current induced in it by the change in current of the superconducting coil due to a quench event.

Other load elements such as diodes may be placed so as to heat a surface of superconducting coils and/or an associated former to provide film boiling according to the invention. Resistive wire or foil may be placed on or within a former, such as a former of composite material, rather than as an overbinding, to provide heating of a surface of the former in contact with liquid cryogen, to induce film boiling at that interface.

Certain embodiments of the present invention address other problems which may be encountered with superconducting magnet structures as shown in FIGS. 3A, 3B.

The performance of superconducting magnets is often limited by the mechanical strength of the superconducting wire, which is typically copper, containing superconducting filaments. In use, the superconducting wire experiences mechanical stress caused by electromagnetic Lorentz forces induced by interaction of the current carried by the superconducting wire with a strong magnetic field produced by the magnet.

The stress state in an annular coil can be described in terms of the axial, radial and hoop stress components. The hoop stress is typically the dominant one affecting performance of a superconducting coil.

The efficiency of use of superconducting wires in magnet designs can be increased by reducing the stress levels for a given coil geometry and a given operating current, without increasing the amount of superconducting wire used.

This problem has been addressed by overbinding the superconducting coils with a strong material, such as stainless steel wire impregnated with a thermosetting resin. Such overbinding constrains deformation of the superconducting coils and keeps a low stress level.

The present invention addresses problems associated with using overbind on superconducting coils in superconducting magnets.

The overbind wire, for example stainless steel, is wound under tension to provide a preloaded tensile hoop stress. This radially compresses the superconducting coil in order to reduce the hoop stress of the superconducting coil in use.

The material of the wire used for the overbind is typically different from that of superconducting wire used for winding the superconducting coil, meaning that the superconducting coil and the overbind are not thermally matched. Where stainless steel wire is used for overbind, it has a lower coefficient of thermal expansion than the superconducting wire. The superconducting wire is typically predominantly of copper, and so has a coefficient of thermal expansion essentially corresponding to that of copper. The overbind 34 must be able to withstand the increased hoop stress caused by the superconducting coil 30 expanding in case of a quench. This problem is conventionally solved by use of stainless steel as the overbind material, since it has very high yield strength.

In a superconducting magnet structure such as shown in FIG. 3B, which may be known as a "serially bonded magnet" or "SBM" structure, such thermal mismatch of the overbind 34 to the superconducting coil 30 and the spacers 32 can generate thermal stresses particularly at or near bonded interfaces. These thermal stresses, in combination with to the high stress in the superconducting coils 30 due to magnetic forces could cause mechanical failure of the magnet.

On cooling, if the thermal contraction of the overbind in the hoop direction is less than that of the associated superconducting coils, as will be the case for stainless steel overbinding over superconducting wire with high copper content, the pre-stressing applied by the overbinding will be reduced. A large winding tension is therefore required when winding the overbind 34 to ensure that the overbind still applies pressure to the superconducting coil 30 when both are cooled to operating temperature.

Preferably, the thermal expansion of the overbind 34 is no greater than that of the superconducting coil 30 either. Resin impregnation of the superconducting coils 30 and overbind 34 is typically performed simultaneously in a single step. During resin impregnation, the structure is heated by the curing resin. If the overbind expands more than the superconducting coil during this step, a small gap will open between the overbind 34 and superconducting coil 30. Resin-rich regions will result in the locations of such gaps once impregnation is complete. Such regions are susceptible to cracking during cool-down, energization and quench. Cracks may occur in the resin-rich region on energization, which may cause quench.

Conventional overbind 34 is not thermally matched to the superconducting coil in the axial direction Z. During cool down and during a magnet quench, this mismatch introduces a significant issue for the overbind 34 bonded to superconducting coils 30 because the differential thermal expansion between the superconducting coil and the associated overbind 34 introduces significant axial stress on each superconducting coil 30 and the associated overbind 34, and shear stress on the interface between superconducting coil and the associated overbind.

In SBM structures, such as shown in FIG. 3B, the overbind 34 is not thermally matched in the radial direction R to the spacers 32. During cool-down and during a quench, this radial thermal mismatch introduces a significant interface stress between overbind 34 and spacer 32, which may cause mechanical damage to the structure.

The high winding tension conventionally used with stainless steel overbind wire may introduce a problem with removing tooling during manufacture because of the resulting high contact pressure of the superconducting coil 30 on the tooling. Furthermore, the requirement for high winding tension when using stainless steel overbinding requires a suitable winding machine capable of providing the required tension. Alternatively, a winding machine with a limited winding tension capability may be used with a stainless steel wire of relatively small wire cross section. This results in a high number of winding turns and a long length of overbind wire, which may be too restrictive for viable manufacturing process.

Certain embodiments of the present invention provide a superconducting magnet structure which comprises a composite overbinding material over the superconducting coils 30. The structure of the composite is arranged to manage the stress levels in the superconducting coils and keep the structure safe during impregnation; during cooling; when cold and energized; and during magnet quench.

The composite overbinding material comprises aluminum or copper wire insulated by braiding such as glass or polyester braiding. This is shown in FIG. 3B by the individual windings of the overbind 34 being schematically shown as enlarged circles, with the right-most circle being labeled to designate the resistive wire surrounded by glass or polymer braid insulation. The insulated wire is wound onto the superconducting coils 30, and the overbinding and superconducting coils are impregnated together with a thermosetting resin.

According to features of certain embodiments of the present invention, the material and dimensions of the wire of the overbinding, and the insulation material, are selected such that the thermal expansion and contraction of the overbind in the hoop, axial and radial directions are different; and are respectively designed to match the corresponding thermal expansion and contraction of adjacent components; either the superconducting coils 30, or the spacers 32, as appropriate.

The parameters of the wire of the overbinding which may be selected to achieve this objective include:
- the material of the wire (aluminum and copper may be suitable);
- the purity of the material of the wire, which may be expressed as a Residual Resistivity Ratio (RRR), which will determine the ohmic heating achieved in the overbind composite in case of a quench;
- the cross-sectional area, which in turn may determine the number of turns required, and so the required length of the wire;
- aspect ratio—the ratio of the dimension in the radial R direction as compared to the dimension in the axial Z direction, assuming an approximately rectangular cross-section;
- the material of the braiding;
- the thickness of the braiding; and
- the volume fraction of the braiding once wound.

Although separation between adjacent turns of wire is determined by the thickness and volume fraction of the braiding, it is largely the material of the thermosetting resin which determines the thermal expansion and contraction of the volumes defined by the braiding.

While the above-listed parameters assume that the wire of the overbinding is of essentially rectangular cross-section, wire of other cross-sections, such as circular or oval may be used, of appropriate.

The overbind composite material will accordingly comprise wire, braid and thermoset resin, and the relative radial, axial and hoop thermal contraction will be determined by the materials and relative dimensions of the wire and the thermoset resin with some influence from the material, thickness and volume fraction of the braid when wound.

In some embodiments, the radial R dimension of the braid may be supplemented by layers of a spacer material such as glass fiber cloth placed between layers of the insulated wire of the overbind.

Figure 5:
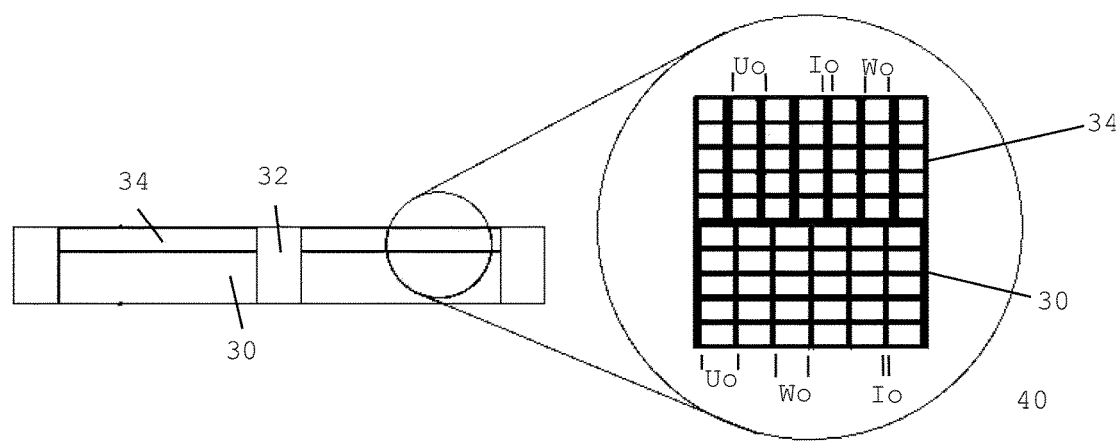
FIG. 5 illustrates an embodiment of a superconducting coil arrangement, with an overbind in accordance with the invention.

FIG. 5 shows an example structure according to a relevant embodiment of the invention. In FIG. 5, overbind 34 is shown over superconducting coils 30 located between spacers 32. The enlarged inset shows more detail of the structure of the composite overbind material. Shown in the enlargement are the axial Z dimensions $W_0$ of the superconducting wire and the overbind wire; the axial dimensions $I_0$ of insulating layers comprising thermoset resin and, where appropriate, insulating braid; and the axial pitch $U_0$ of adjacent turns, where $U_0 = W_0 + I_0$. Similar dimensions could be identified in the radial direction R.

The dimensions and materials of the overbind wire and braid are selected so that hoop thermal contraction of the overbind composite 34 is greater than that of superconducting coils 30. The overbind composite 34 will apply increasing hoop pressure onto the superconducting coils 20 when cooled down, and therefore reduce the coil hoop stress when energized. This permits the use of reduced winding tension for the wire of the overbind, since aluminum or copper wire-based overbind composite 34 will contract more than a copper-based superconducting coil 30, as compared to a stainless-steel wire-based overbind composite, which will contract less than a copper-based superconducting coil. The reduced winding tension must be sufficient to ensure that no gap arises between the wire of the overbind and the superconducting coil when they are heated up during impregnating process. Stress in the overbind itself is controlled by the thickness of the overbind composite on the superconducting coil.

The dimensions and materials of the overbind wire and braid are selected so that the axial Z thermal contraction of the overbind composite matches the axial Z thermal contraction of the superconducting coils. In the context of the present invention, "match" means the same or very close to.

The dimensions and materials of the overbind wire and braid are selected so that the radial R thermal contraction of the overbind composite matches the radial thermal contraction of the spacers 32.

These matched thermal contractions ensure that the thermal stresses between the superconducting coils 30, spacers 32 and overbind 34 are at low levels during operation and quench.

The overbind wire is of a relatively conductive resistive wire such as aluminum or copper and is inductively coupled with the superconducting coils. During a quench, the falling magnetic field of the superconducting coils induces a current in the wire of the overbind, which is ohmically heated. Preferably, this causes the overbind composite 34 to thermally expand, matching the thermal expansion of the superconducting coils 30. This will limit thermal stresses in the superconducting coils and overbind during a magnet quench by providing a relatively constant compression of the superconducting coils by the overbind throughout the quench event.

Certain embodiments of the present invention accordingly employ an optimized overbind composite which has the combined features of a high thermal contraction in hoop direction, high electrical conductivity and electrically insulated turns. The thermal contractions of the overbind in the axial direction and in the radial direction are tuned to match the axial and radial thermal contraction of an associated coil, and adjacent spacer(s), respectively. The relatively high hoop thermal contraction of the material of the wire of the overbind enables the overbind to be wound with a reduced winding tension, because increased compressive hoop stress is achieved on cooling, although the reduced winding tension must be sufficient to ensure that no gap arises between the overbind 34 and the superconducting coil 30 when they are heated up during impregnating process). The reduced winding tension enables wire of increased cross-sectional area to be used, resulting in shorter wire lengths, and fewer turns to be wound. The radial thickness of the overbind composite can be controlled to ensure that the stress in the overbind composite is less than its yield strength. Overstressing of the overbind composite during a magnet quench is avoided by inductive ohmic heating in the wire of the overbind, which heats the overbind composite at a similar rate as the superconducting coil.

Figures 6A, 6B, 6C:
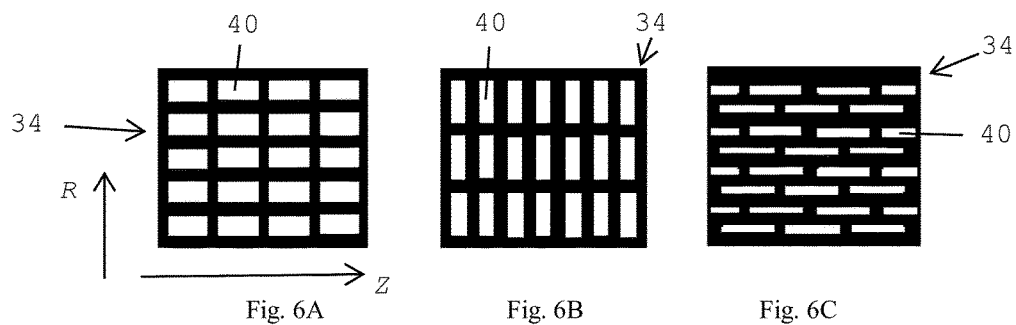
FIGS. 6A-6C respectively show examples of axial cross-sections through the overbind in accordance with the invention, with different winding patterns.

FIGS. 6A-6C show example axial cross-sections through overbind composite, and illustrate different winding patterns of the overbind wire which may be selected in order to achieve a required combination of radial R, axial Z and hoop thermal expansion/contraction. In the winding pattern of FIG. 6A, the axial Z dimension of the wire 40 is greater than its radial R dimension, and turns of one layer are aligned with turns of the layer below it. In the winding pattern of FIG. 6B, the axial Z dimension of the wire 40 is less than its radial R dimension, and turns of one layer are aligned with turns of the layer below it. In the winding pattern of FIG. 6C, turns of one layer are offset with respect to with turns of the layer below it, but aligned to the turns of the layer below that. Such arrangement may be preferred with wire 40 of circular or oval cross-section.

Aluminum or copper overbind wire will not interfere with the magnetic field generated by the superconducting coils. Conventional stainless steel overbind wire has a magnetic component due to its iron content, and may affect the homogeneity of magnet field of the superconducting coils.

In comparison to stainless steel overbind wire, which results in a reduction in the hoop stress after cooled down because of the lower hoop thermal contraction, aluminum or copper overbind wire requires only a lower winding tension, yet provides a higher hoop tensile stress after cooling. Insulated aluminum or copper overbind wire provides reduced hoop stress during a quench because of the inductive ohmic heating.

The inductive coupling of the overbind results in energy transfer from the superconducting coils to the overbind composite. The peak quench temperatures and voltages of the superconducting coils are thereby reduced.

In certain embodiments of the invention, overbind wire 40 on multiple superconducting coils 30 is electrically connected together to form an electrical circuit. By selecting the resistivity of the overbind wire 40 and/or introducing one or more resistive elements in series with the overbind wire on one or more superconducting coils 30, the inductive thermal heating of the overbind wire can be tuned such that the thermal expansion of the overbind composite 34 matches that of the superconducting coil 30 during a quench.

Although modifications and changes may be suggested by those skilled in the art, it is the intention of the inventors to embody within the patent warranted hereon all changes and modifications as reasonably and properly come within the scope of their contribution to the art.

We claim:

1. A superconducting magnet coil arrangement comprising:
   a plurality of superconducting coils;
   at least one of said superconducting coils having a secondary coil comprised of insulated resistive wire mechanically attached to a surface of said at least one superconducting coil; and
   said insulated resistive wire being insulated by a braid selected from the group consisting of a glass braid and a polymer braid.

2. A superconducting magnet coil arrangement as claimed in claim 1 wherein said secondary coil is formed as an overbinding over said at least one superconducting coil.

3. A superconducting magnet coil arrangement as claimed in claim 1 wherein said superconducting coils are impregnated, and are bonded together by spacers.

4. A superconducting magnet coil arrangement as claimed in claim 3 wherein said spacers are porous structures impregnated with a same impregnation resin as said superconducting coils.

5. A superconducting magnet coil arrangement as claimed in claim 1 wherein said resistive wire is an aluminum wire.

6. A superconducting magnet coil arrangement as claimed in claim 1 wherein said resistive wire is a copper wire.

7. A superconducting magnet coil arrangement as claimed in claim 1 wherein said at least one superconducting coil and said secondary coil mechanically attached thereto are impregnated together with a thermosetting resin.

8. A superconducting magnet coil arrangement as claimed in claim 7 wherein said resistive wire of said secondary coil, said braid, and said thermosetting resin form an overbind composite, and wherein respective dimensions and materials of said resistive wire, said thermal setting resin and said braid of said overbind composite are selected to give said overbind composite respective expansion coefficients in a hoop direction, an axial direction, and a radial direction that are different from each other.

9. A superconducting magnet coil arrangement as claimed in claim 8 comprising adjacent components that are adjacent to said overbind composite, and wherein said thermal expansion coefficients of said overbind composite in said hoop, axial and radial directions match corresponding thermal expansion coefficients of said adjacent components.

10. A superconducting magnet coil arrangement as claimed in claim 8 wherein said overbind composite has a cross-section selected from the group consisting of a circular cross-section and an oval cross-section.

11. A superconducting magnet coil arrangement as claimed in claim 8 wherein said insulation braid is formed in a plurality of layers in said overbind composite, with the respective layers of said insulation brain being separated by a spacer material.

12. A superconducting magnet coil arrangement as claimed in claim 8 wherein multiple superconducting coils, among said plurality of superconducting coils, each have a respective secondary coil of insulated resistive wire mechanically attached to a surface of the respective superconducting coil, and wherein each insulated resistive wire is a braid selected from the group consisting of a glass braid or a polymer braid, and wherein superconducting coil and the respective secondary coil attached thereto is impregnated with a thermosetting resin forming a respective overbind composite, and each overbind composite having a radially outer surface with the respective overbind composites being joined together at the respective radially outer surfaces thereof by spacers.

13. A superconducting magnet coil arrangement as claimed in claim 12 wherein the radial thermal expansion coefficient of each overbind composite matches a radial thermal expansion coefficient of said spacers.

14. A superconducting magnet coil arrangement as claimed in claim 12 wherein the respective insulated resistive wires of respective superconducting coils among said multiple superconducting coils are electrically connected together to form an electrical circuit.

15. A superconducting magnet coil arrangement as claimed in claim 8 wherein the hoop thermal expansion coefficient of said overbind composite is greater than a hoop thermal expansion coefficient of said at least one superconducting coil.

16. A superconducting magnet coil arrangement as claimed in claim 8 wherein the axial thermal expansion coefficient of said overbind composite is greater than a axial thermal expansion coefficient of said at least one superconducting coil.

17. A superconducting magnet coil arrangement as claimed in claim 1 wherein said insulated resistive wire is inductively coupled with said at least one superconducting coil.

18. A superconducting magnet coil arrangement as claimed in claim 1 wherein said insulated resistive wire has an axial cross-section with an axial dimension that is greater than a radial dimension.

19. A superconducting magnet coil arrangement as claimed in claim 1 wherein said insulated resistive wire has an axial cross-section with an axial dimension that is less than a radial dimension.

20. A superconducting magnet coil arrangement as claimed in claim 1 wherein said insulated resistive wire has an axial cross-section with an axial dimension and a radial dimension that differ from each other, and wherein said insulated resistive wire is formed as multiple layers of turns respectively aligned with each other.

21. A superconducting magnet coil arrangement as claimed in claim 1 wherein said insulated resistive wire has an axial cross-section with an axial dimension and a radial dimension that differ from each other, and wherein said insulated resistive wire is formed with multiple layers of turns, with turns of one layer being offset with respect to turns of a layer immediately below said one layer, but aligned with turns of a layer below the layer that is immediately below said one layer.

22. A superconducting magnet coil arrangement as claimed in claim 1 comprising at least one resistive element electrically connected in series with said insulated resistive wire.

23. A method for reducing a quench pressure within a cryogen vessel that contains a superconducting magnet arrangement comprising a plurality of superconducting coils, wherein at least one of said superconducting coils has a secondary coil of insulated resistive wire mechanically attached to a surface of said at least one superconducting coil, said method comprising:
  immersing said superconducting magnet coil arrangement in liquid cryogen in said cryogen vessel with said insulated resistive wire of said secondary coil being in contact with said liquid cryogen; and
  upon occurrence of a quench, heating a surface of said secondary coil, by supplying electrical current to said secondary coil, to a temperature that causes film boiling of said liquid cryogen in contact with said secondary coil.

24. A method as claimed in claim 23 comprising using liquid helium as said liquid cryogen, and heating said surface of said secondary coil with a temperature that exceeds that 100K.

25. A method as claimed in claim 24 comprising using said electrical current in said secondary coil by a change in a magnetic field generated by said superconducting magnet coil arrangement during said quench.

26. A method as claimed in claim 23 comprising generating said electrical current in said secondary coil by a quench propagation circuit.

* * * * *